(12) United States Patent
Kim et al.

(10) Patent No.: US 6,477,094 B2
(45) Date of Patent: Nov. 5, 2002

(54) MEMORY REPAIR CIRCUIT USING ANTIFUSE OF MOS STRUCTURE

(75) Inventors: Phil-Jung Kim, Kyoungki-do (KR); Jae-Kyung Wee, Kyoungki-do (KR); Chang-Hyuk Lee, Kyoungki-do (KR); Young-Ho Seol, Kyoungki-do (KR); Jin-Keun Oh, Kyoungki-do (KR); Ho-Youb Cho, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 30 days.

(21) Appl. No.: 09/737,871

(22) Filed: Dec. 18, 2000

(65) Prior Publication Data

US 2001/0022746 A1 Sep. 20, 2001

(30) Foreign Application Priority Data

Dec. 29, 1999 (KR) .............................. 99-65005

(51) Int. Cl.$^7$ ................................................ G11C 7/00
(52) U.S. Cl. .................................... 365/200; 365/225.7
(58) Field of Search .......................... 365/200, 225.7, 365/96, 189.05, 189.09, 189.02; 327/525, 526; 257/50, 530

(56) References Cited

U.S. PATENT DOCUMENTS

| | | | | | |
|---|---|---|---|---|---|
| 5,831,923 A | * | 11/1998 | Casper | ..................... | 365/225.7 |
| 5,844,298 A | * | 12/1998 | Smith et al. | ................. | 257/530 |
| 6,108,261 A | * | 8/2000 | Kim et al. | ................ | 365/225.7 |
| 6,125,069 A | * | 9/2000 | Aoki | ........................ | 365/225.7 |

* cited by examiner

*Primary Examiner*—Son T. Dinh
*Assistant Examiner*—Anh Phung
(74) *Attorney, Agent, or Firm*—Finnegan, Henderson, Farabow, Garrett & Dunner, L.L.P.

(57) ABSTRACT

A memory repair circuit uses an antifuse of MOS structure, capable of repairing defective cells by constructing the antifuse by MOS transistors and programming the antifuse circuit properly. The memory repair circuit comprises a plurality of antifuse devices, each programmed when a power voltage and a negative voltage are supplied respectively to a first electrode and a second electrode thereof; a latch for detecting and latching program states of the antifuse devices; and a redundancy block for replacing a defect cell with a redundancy cell depending on the output of the latch.

32 Claims, 10 Drawing Sheets

MEMORY REPAIR CIRCUIT USING ANTIFUSE OF MOS STRUCTURE

FIELD OF THE INVENTION

The present invention relates to a memory repair circuit; and, more particularly, to an antifuse of MOS structure and a memory repair circuit using the antifuse.

PRIOR ART OF THE INVENTION

According to development of the semiconductor integrated circuit, more circuit devices is included in a given silicon area. On the other hand, in order to reduce or eliminate defects in the circuit devices, more circuit devices are required. Circuit designers make efforts to decrease size of the individual circuit to accomplish higher integration by maximizing die usage ratio. Such down-sizing makes the circuit devices influenced by defects due to contaminant during manufacturing. The defect should be detected during a test procedure performed after integrated circuit manufacture step or semiconductor chip level or package completion. When the defect is detected, especially, a small number of circuit devices has substantially the defect, it is not desirable to throw out the integrated circuit having the defective circuit device.

Since zero defect in manufacture of the integrated circuit cannot be expected, a redundant circuit is provided to reduce the thrown integrated circuit. When a first device is determined as defective one, the redundant circuit replaces the first device. Substantial reduce of the thrown integrated circuit can be accomplished by the redundant circuit device without increase of cost of the integrated circuit.

For example, there are DRAM, SRAM, VRAM and EPROM among the integrated circuit using the redundant circuit device. The typical integrated memory circuit includes a multiplicity of memories disposed at an array of addressable rows and columns. Each of the memories at the rows and columns is the first circuit device. By providing the redundant circuit device, a first row, column or bit that is defective can be replaced.

Since the first circuit device of the individual integrated memory circuit can be addressable separately, fuse blowing or an antifuse of a fuse control programmable circuit for programming the redundant circuit depending on the address of the defective first circuit device is required to replace the defective device. This procedure is very effective in replacement of the defective device permanently.

For example, for the DRAM, a particular cell is selected by providing the address for the row and column at which the particular cell is located. The redundant circuit should perceive the valid first memory circuit device and, when the address for the first circuit device is provided by a user, all signals should be changed for the redundant circuit device. Accordingly, a number of the fuses or antifuses are coupled to the corresponding redundant circuit device. A possible combination of blown or unblown fuses corresponding to the redundant circuit devices represents a single address of all of the first devices to be replaced by the corresponding redundant device.

The antifuse is a device coupling two electrodes by using dielectric breakdown of electrode/insulator/electrode structure. Dielectric breakdown voltage of the insulator is referred as a program voltage (PGM) of the antifuse, at which the two electrodes are shorted by a program.

SUMMARY OF THE INVENTION

Therefore, it is an object of the present invention to provide a memory repair circuit using an antifuse of MOS structure, capable of repairing defective cells by constructing the antifuse by MOS transistors and programming the antifuse circuit properly.

In accordance with an aspect of the present invention, there is provided a memory repair circuit comprising: a plurality of antifuse devices, each programmed when a power voltage and a negative voltage are supplied respectively to a first electrode and a second electrode thereof; a latching means for detecting and latching program states of the antifuse devices; and a redundancy block for replacing a defect cell with a redundancy cell depending on the output of the latching means.

In accordance with an aspect of the present invention, there is provided a memory repair circuit comprising: a power-up reset circuit for outputting a power voltage when the power transits from 0 V to a predetermined voltage; an address multiplexer for outputting a signal for selecting a fuse to program; a voltage generator for supplying a program voltage; an antifuse circuit for programming an antifuse device depending on outputs of the power-up reset circuit, the address multiplexer and the voltage generator and sensing whether the antifuse device is programmed; and a redundancy block for replacing a detective cell with a redundancy cell depending on the output of the antifuse circuit.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

Hereinafter, preferred embodiments of the present invention will be described in detail with reference to the accompanying drawings.

Figure 1A:
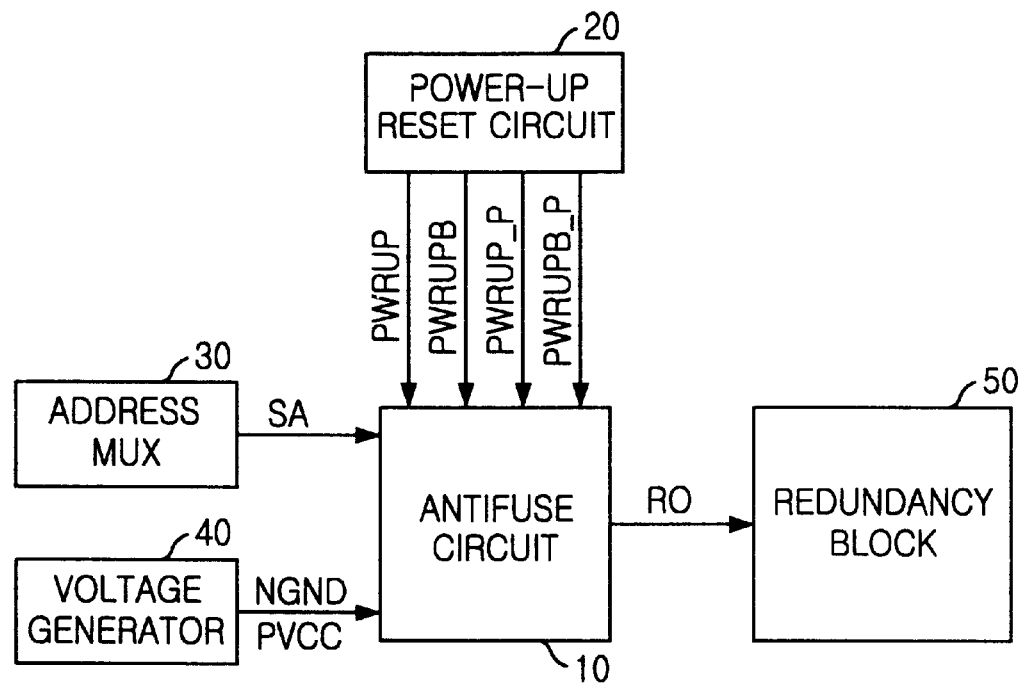
FIG. 1A is a block diagram for explaining a memory repair circuit using an antifuse in accordance with the present invention.

FIG. 1A is a block diagram for explaining a memory repair circuit using an antifuse in accordance with the present invention. The repair circuit of the present invention comprises an antifuse circuit 10 for programming an antifuse and determining whether the antifuse is programmed, a power-up reset circuit 20 for outputting a VCC when a power voltage transits from 0 V to a predetermined voltage, an address multiplexer 30 for outputting a signal for selecting the antifuse to program, a voltage generator 40 for supplying a program voltage and a redundancy block 50 for replacing a detective cell with a redundancy cell depending on an output signal RO of the antifuse circuit 10. For example, the voltage generator 40 outputs −4 V (NGND) or 0 V through a node port of a PN diode D1 coupled between a negative voltage generating port and a ground and, on the other hand, outputs 8 V (PVCC) or 3.3. V (VCC) through a cathode port of a PN diode D2 coupled between a VCC port and a PVCC port.

Figure 1B:
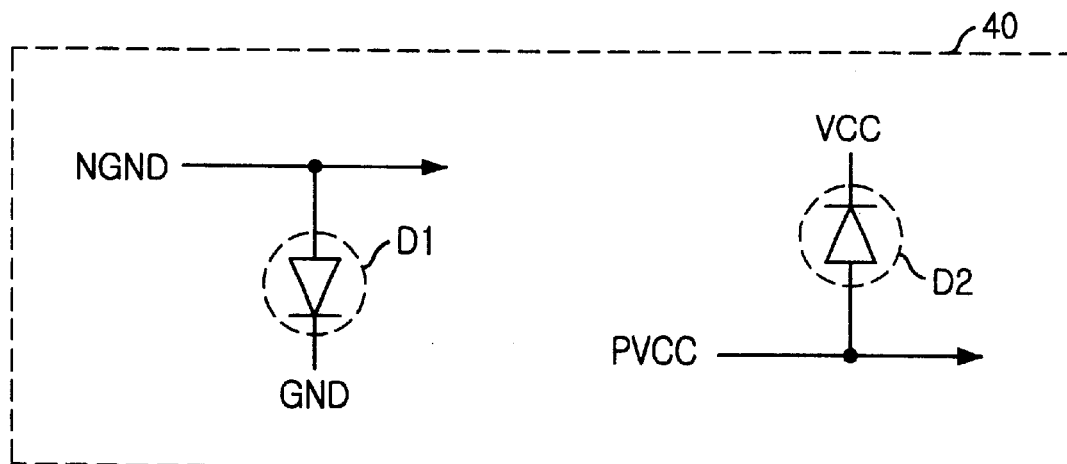
FIG. 1B is a diagram for explaining output state of a voltage generator in FIG. 1A.
Figure 2:
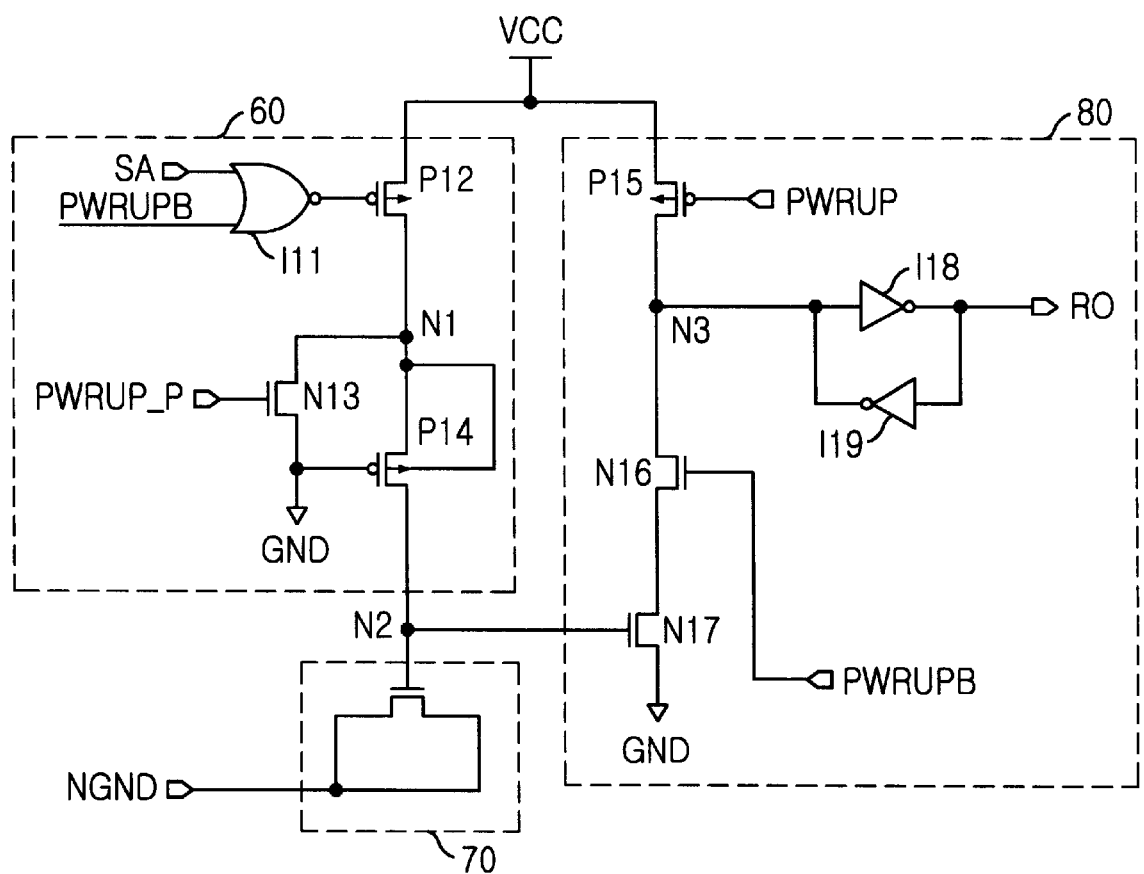
FIG. 2 is a diagram of a first embodiment of an antifuse circuit in FIG. 1.

FIG. 2 is a diagram of a first embodiment of the antifuse circuit in FIG. 1. The antifuse circuit programs the antifuse by using voltage difference between VCC(3.3 V) and NGND(−4 V) and includes a bias controlling unit 60, an antifuse device 70 and a latching unit 80. It will be described for the operation of the antifuse circuit referring to FIG. 5A.

Initialization operation

Figure 5A:
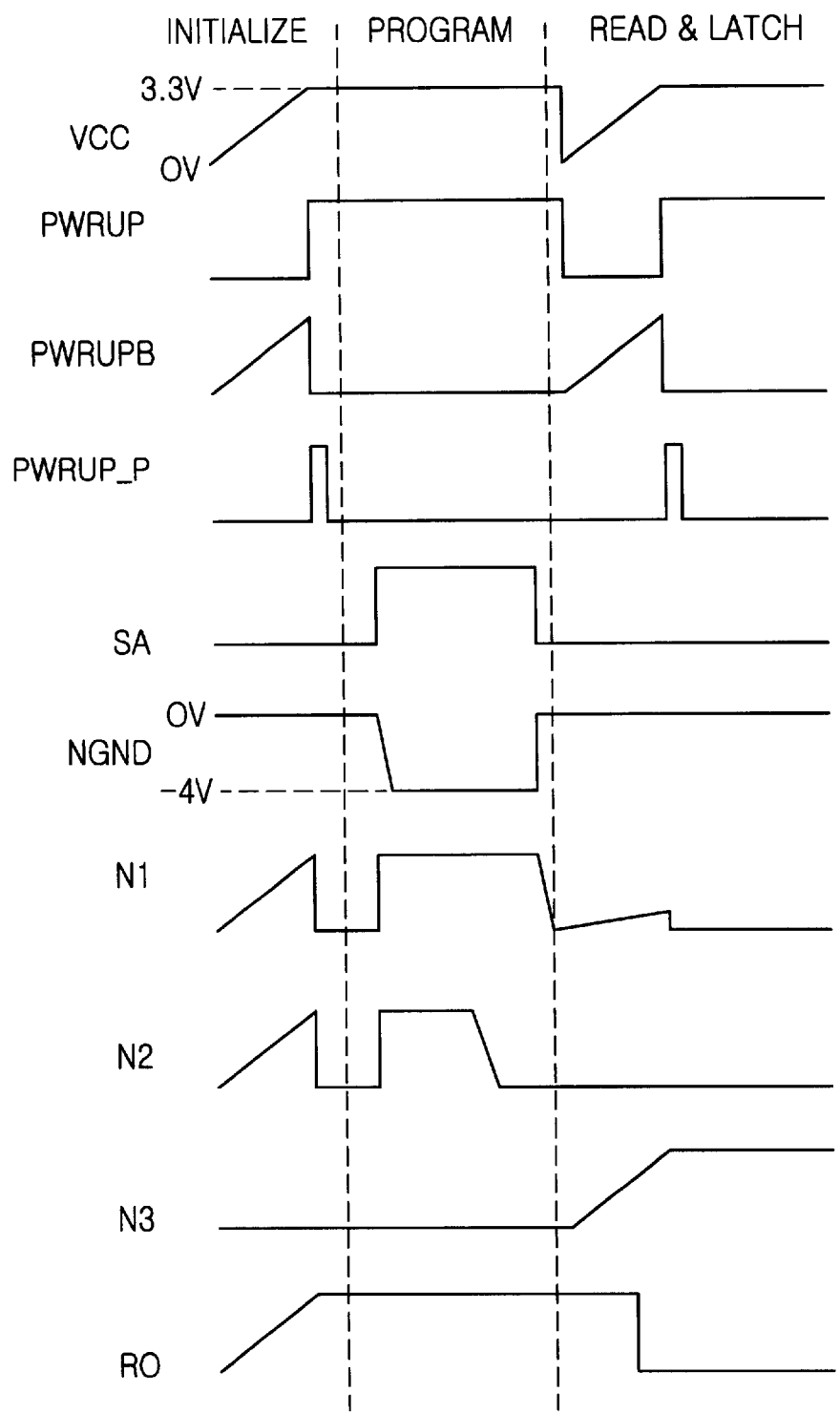
FIG. 5A is a diagram for operation of FIG. 2.

When a control signal PWRUPB from the power-up reset circuit 20 is high as shown in FIG. 5A and a special address SA is low, an output of a NOR gate 111 becomes low so that the power voltage VCC is transferred to the first node N1 through a PMOS transistor P12. Because a control signal PWRUP from the power-up reset circuit 20 is low, the power voltage VCC is transferred to a third node N3 through a PMOS transistor P15 and an NMOS transistor N16 is turned on by the control signal PWRUPB and an NMOS transistor N17 is turned on by high voltage of a second node N2 so that the output of the latching unit having inverting gates 118 and 119 becomes high.

Program operation

When power is stabilized and the control signal PWRUP transits to high to a short pulse, the first and the second nodes N1, N2 are initialized. When the special address SA for selecting the antifuse device is high, the VCC is applied to one electrode of the antifuse device 70, i.e., the second node N2. At that time, because the output GND of the voltage generator 40 becomes, e.g., −4 V, and is transferred to the other electrode of the antifuse device 70, the voltage difference of the two electrode of the antifuse device 70 becomes 7 V so that the antifuse device 70 is programmed.

Read and latch operation

After completion of the program operation, the power is turned off and then stabilized for a time as shown in FIG. 5. At that time, the control signal PWRUPB is high and the output of the NOR gate 111 becomes low. Therefore, the VCC is transferred to the first and the second nodes N1, N2, when the antifuse device 70 is programmed, and the voltage of the second node N2 is conducted to the ground through the antifuse device 70 to become low. Since the control signal PWRUP becomes low, the third node N3 transits to VSS but the second node N2 is low so that current pass to the ground is isolated.

The antifuse device 70 used in FIG. 2 can be constructed as shown in FIGS. 4A to 4D and it will be described for this construction as follows.

Figure 4A:
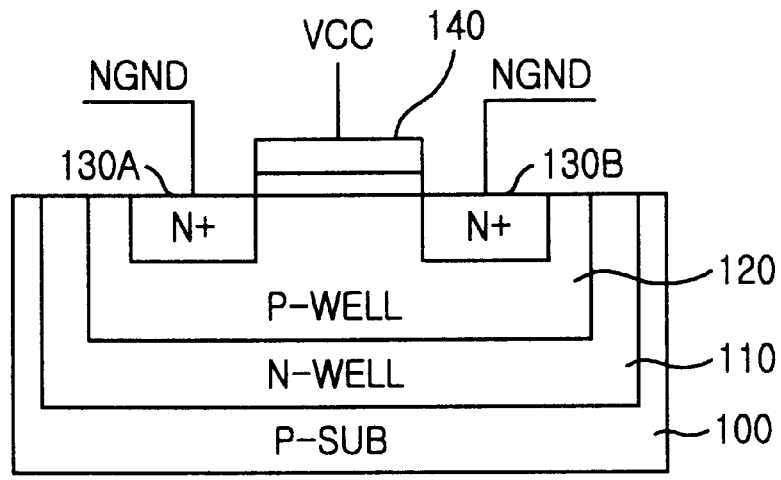
FIGS. 4A, 4B, 4C and 4D are diagrams for showing construction of the antifuse device used in FIG. 2.

Referring to FIG. 4A, an N well 110 is formed in a P-type substrate 100 and a P well 120 is formed in the N well 110. A first N+ area 130A and a second N+ area 130B are formed in the P well 120 and an insulation film and a gate electrode 140 are subsequently formed on top of the substrate 100 between the first and the second N+ areas 130A and 130B. A gate electrode 140 is coupled to the VCC and the first and the second N+ areas 130A and 130B are coupled to the negative voltage generating port NGND of the voltage generator 40 in FIG. 1.

Figure 4B:
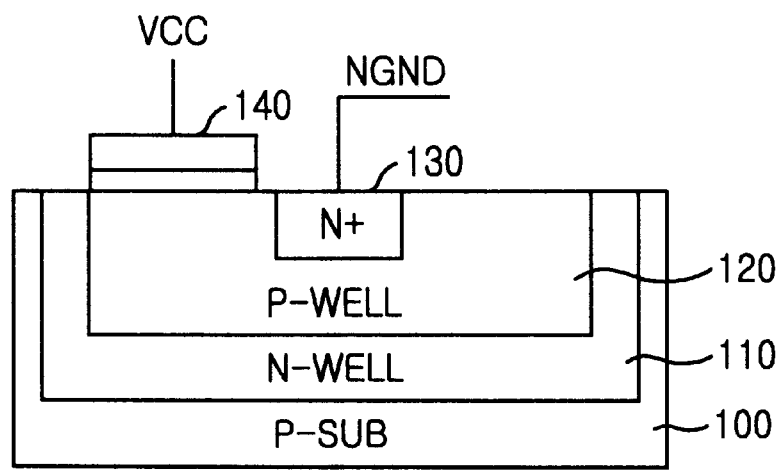

Referring to FIG. 4B, an N well 110 is formed in a P-type substrate 100 and a P well 120 is formed in the N 110. A N+ area 130 is formed in the P well 120 and an insulation film and a gate electrode 140 are subsequently formed on top of the substrate 100 aside of the N+ areas 130. A gate electrode 140 is coupled to the VCC and the N+ area 130 is coupled to the negative voltage generating port NGND of the voltage generator 40 in FIG. 1.

Figure 4C:
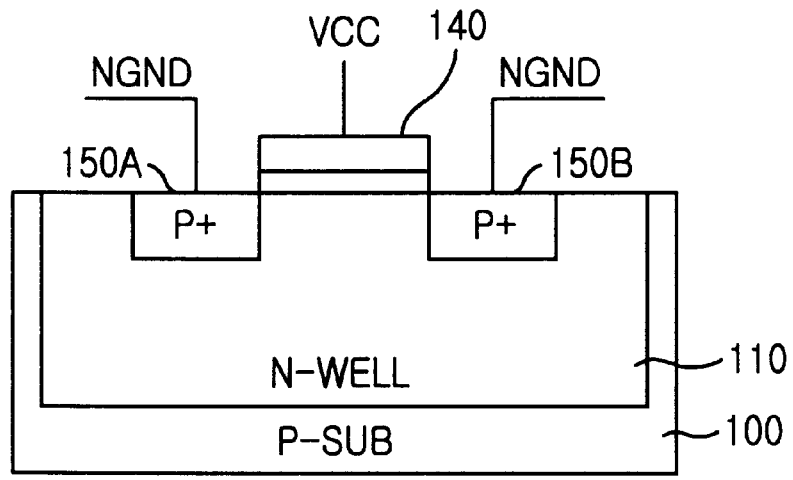

Referring to FIG. 4C, an N well 110 is formed in a P-type substrate 100. A first P+ area 150A and a second P+ area 150B are formed in the N well 110 and an insulation film and a gate electrode 140 are subsequently formed on top of the substrate 100 between the first and the second P+ areas 150A and 150B. A gate electrode 140 is coupled to the VCC and the first and the second P+ areas 150A and 150B are coupled to the negative voltage generating port NGND of the voltage generator 40 in FIG. 1.

Figure 4D:
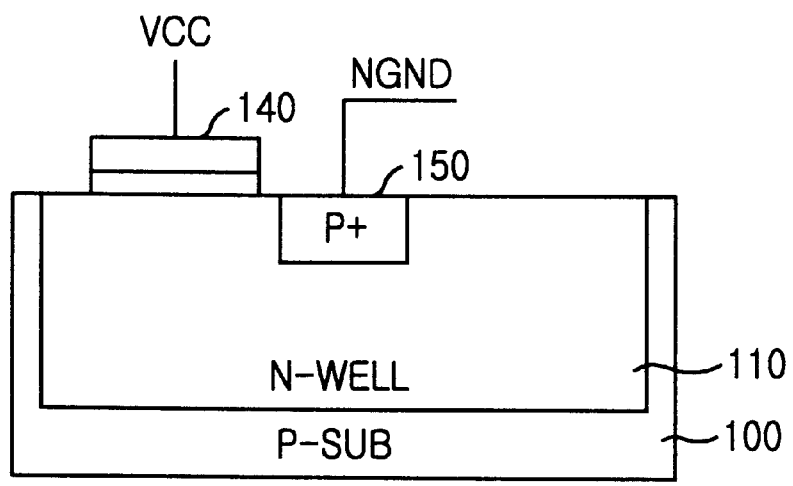

Referring to FIG. 4D, an N well 110 is formed in a P-type substrate 100 and a P+ area is formed in the N well 110. An insulation film and a gate electrode 140 are subsequently formed on top of the substrate 100 aside of the P+ areas 150. A gate electrode 140 is coupled to the VCC and the P+ area 150 is coupled to the negative voltage generating port NGND of the voltage generator 40 in FIG. 1.

In FIGS. 4A to 4D, by coupling the VCC (3.3 V) to the gate electrode and the NGND (−4 V) to a junction, dielectric breakdown is occurs at an edge between the gate electrode and the junction so that it is turned on between the gate electrode and the junction. The antifuse device as shown in FIGS. 4A and 4B is constructed by triple well NMOS transistor and that as shown in FIGS. 4C and 4D is constructed by triple well PMOS transistor. The P well as shown in FIGS. 4A and 4B is remained as floating state or coupled to the negative voltage generating port NGND of the voltage generator 40 and the N well is coupled to the VCC. The N well as shown in FIGS. 4C and 4D is remained as floating state.

Figure 3:
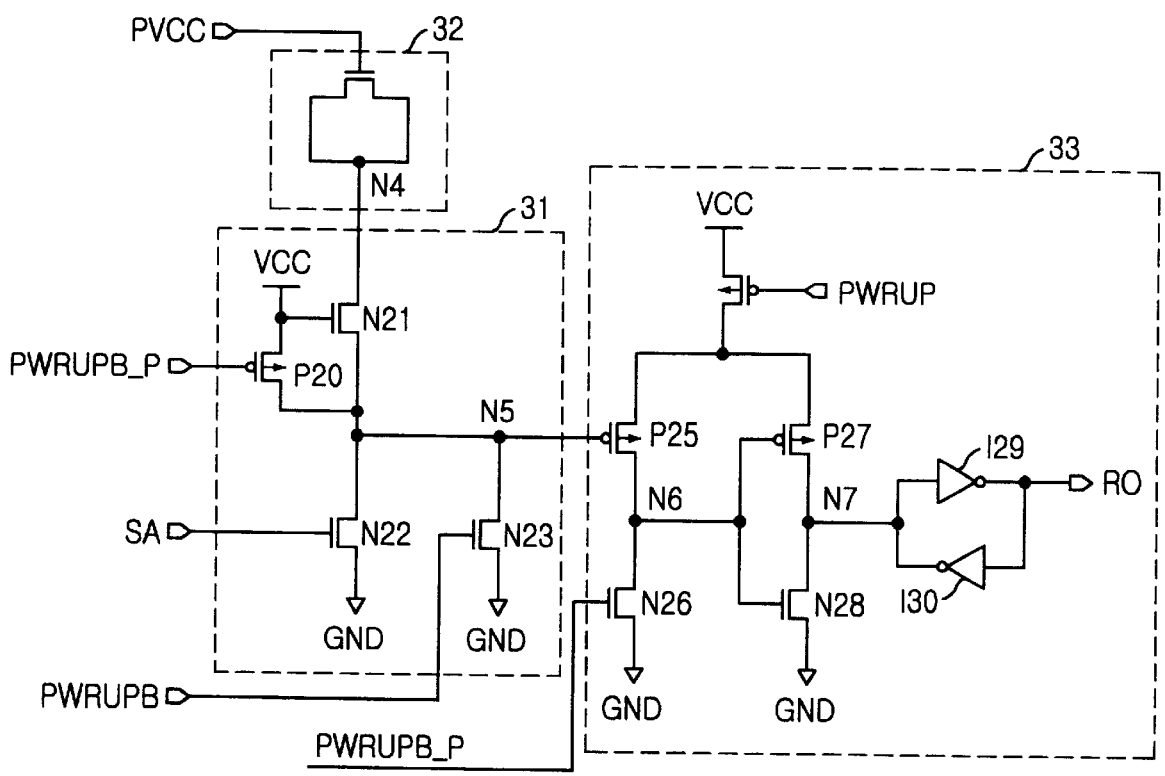
FIG. 3 is a diagram of a second embodiment of the antifuse circuit in FIG. 1.

FIG. 3 is a diagram of a second embodiment of the antifuse circuit in FIG. 1. In FIG. 3, a positive voltage generated at the voltage generator 40 is applied to the antifuse device and the antifuse circuit comprises an antifuse device 32, a bias controlling unit 31 and a latching unit 33. It will be described for operation of the antifuse circuit in FIG. 3 referring to FIG. 5B.

Initialization operation

Figure 5B:
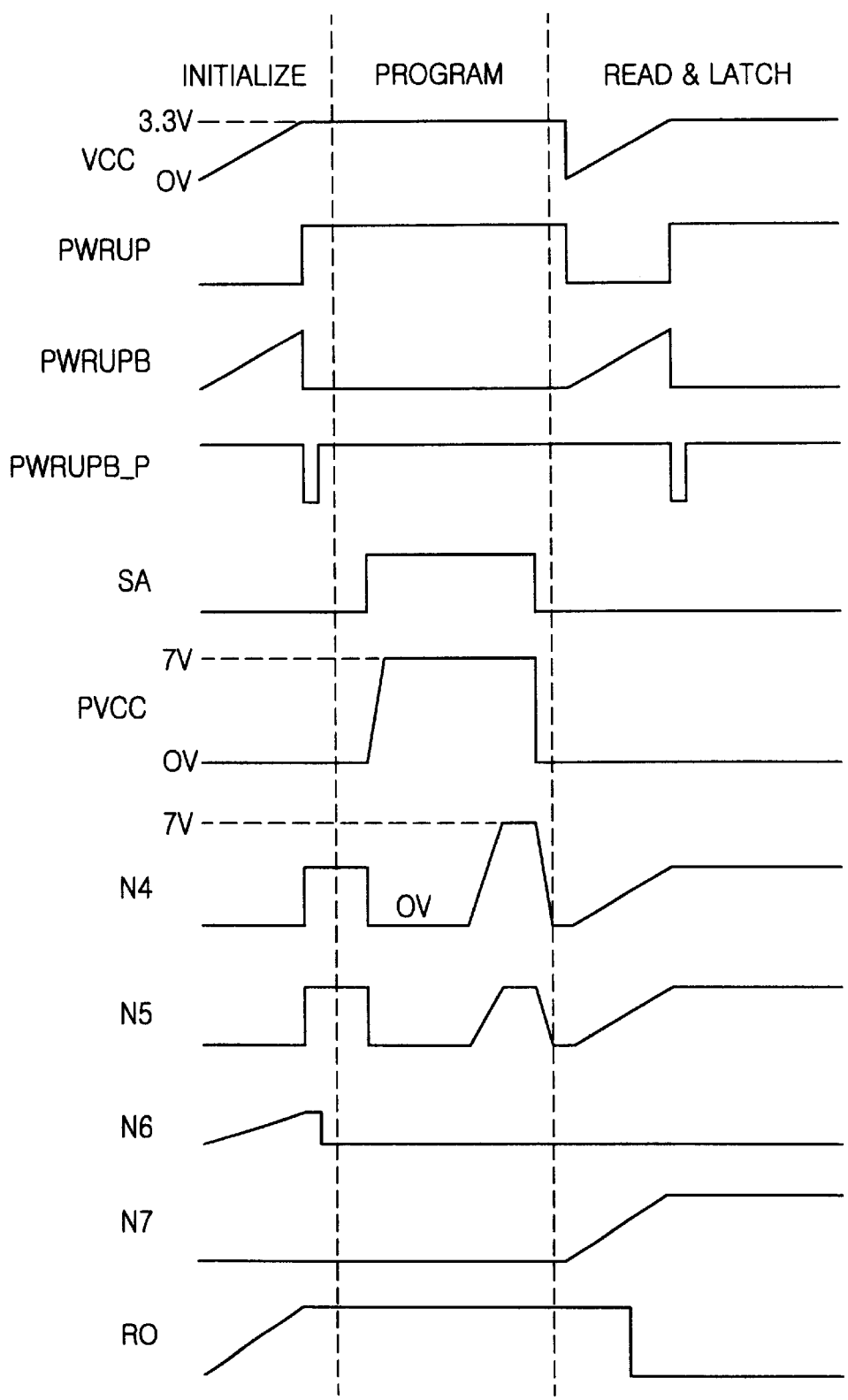
FIG. 5B is a diagram for operation of FIG. 3.

As shown in FIG. 5B, because the VCC is transferred to a gate electrode of the antifuse device 32 during initialization period (power stabilization period) but the antifuse 32 is not programmed (off state), the VCC is not transferred to a fourth node N4.

Because the control signal PWRUP_P in FIG. 5B is high, a PMOS transistor P20 is turned off and an NMOS transistor N21 is turned on but the state of the fourth node N4 is low, a fifth node N5 becomes low. At that time, because the special address SA is low, the NMOS transistor N22 is turned off. Because the control signal PWRUPB is high, an NMOS transistor N23 that is designed to have high resistance is turned on so that the fifth node N5 becomes low. Because the control signal PWRUP is low, the VCC is transferred to a sixth and a seventh nodes N6, N7 through transistors P24, P25, P27. At that time, because the control signal PWRUP_P is high and the on-resistance of an NMOS N26 is high, the sixth node N6 has a constant voltage. Depending on the voltage of the sixth node N6, the PMOS transistor P27 is off while a NMOS transistor N28 is turned on so that the seventh node N7 becomes low. Therefore, the output RO of the latch including inverters 129, 130 becomes low. After the power is stabilized, the control signal PWRUP is high and the control signal PWRUPB is low so that the PMOS transistor P24 and the NMOS transistor N23 are turned off. If the control signal PWRUP_P transits to low as the short pulse, the PMOS transistor P20 is turned on and the VCC is applied to the fifth and the fourth nodes N5, N4 to be initialized. When the control signal PWRUP_P becomes high, the PMOS transistor P20 is turned off while the NMOS transistor N26 is turned on so that the sixth node N6 becomes low.

Program operation

When the special address SA becomes high, the NMOS transistor N22 is turned on so that the fourth and the fifth nodes N4, N5 become high. If a high voltage, e.g., higher than 7 V, is outputted from the positive voltage output port of the voltage generator 40 in FIG. 1, since the antifuse device is programmed and the high voltage is transferred to the fourth node N4 through the antifuse device 32 but the gate voltage of the NMOS transistor N21 is VCC (3.3 V), the voltage difference between the gate and the fourth node N4 is less than 4 V that is lower than the breakdown voltage so that operation can be performed stably.

Read and latch operation

After completion of the program operation, as shown in FIG. 5B, the power is turned off and then stabilized for a time and the control signal PWRUP_P is high and the PMOS transistor P20 is turned off. Because the VCC is transferred to the antifuse device 32 through the positive voltage output port VCC of the voltage generator 40 and the antifuse device 32 is programmed (on state), the VCC is transferred to the fourth and the fifth nodes N4, N5. Because the special address SA is low, the NMOS transistor N22 is turned off. Since the control signal PWRUPB is high but the on-resistance of the NMOS transistor N23 is very high, little current is passed through the NMOS transistor N23. Therefore, the fifth node N5 remains as high. Because the sixth node is low, the PMOS transistor N27 is turned on while the NMOS transistor N28 is turned off, the VCC is transferred to the seventh node N7 through the PMOS transistors P24, P27. Therefore, the seventh node N7 becomes high and the output of the latching unit 33 becomes low.

The antifuse device 32 used in FIG. 3 can be constructed as shown in FIGS. 6A to 6F and it will be described for this construction as follows.

Figure 6A:
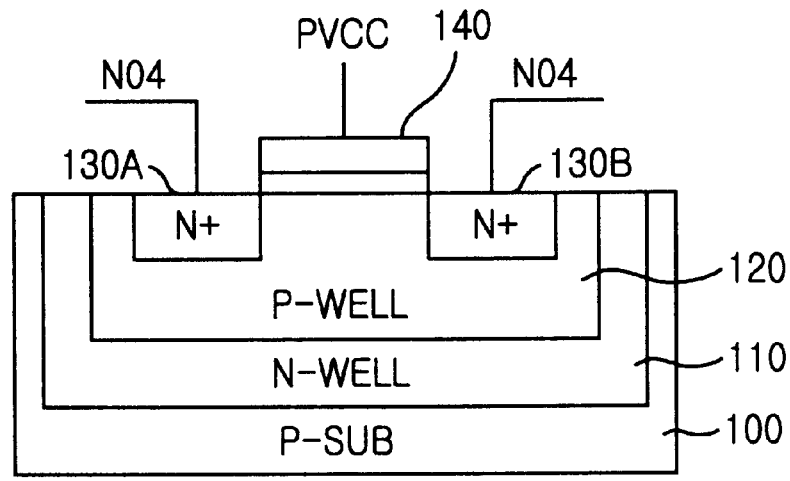
FIGS. 6A, 6B, 6C, 6D, 6E and 6F are diagrams for showing construction of the antifuse device used in FIG. 3.

Referring to FIG. 6A, an N well 110 is formed in a P-type substrate 100, a P well 120 is formed in the N well 110. A first N+ area 130A and a second N+ area 130B are formed in the P well 120 and an insulation film and a gate electrode 140 are subsequently formed on top of the substrate 100 between the first and the second N+ areas 130A and 130B. A gate electrode 140 is coupled to the positive voltage generating port PVCC of the voltage generator 40 in FIG. 1 and the first and the second N+ areas 130A and 130B are coupled to the fourth node N4 in FIG. 3.

Figure 6B:
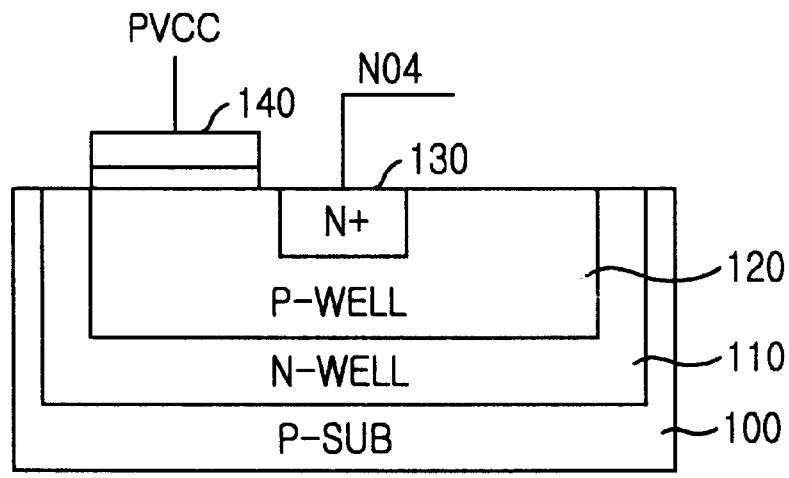

Referring to FIG. 6B, an N well 110 is formed in a P-type substrate 100 and a P well 120 is formed in the N 110. A N+ area 130 is formed in the P well 120 and an insulation film and a gate electrode 140 are subsequently formed on top of the substrate 100 aside of the N+ areas 130. A gate electrode 140 is coupled to the positive voltage generating port PVCC of the voltage generator 40 in FIG. 1 and the N+ areas 130 is coupled to the fourth node N4 in FIG. 3.

Figure 6C:
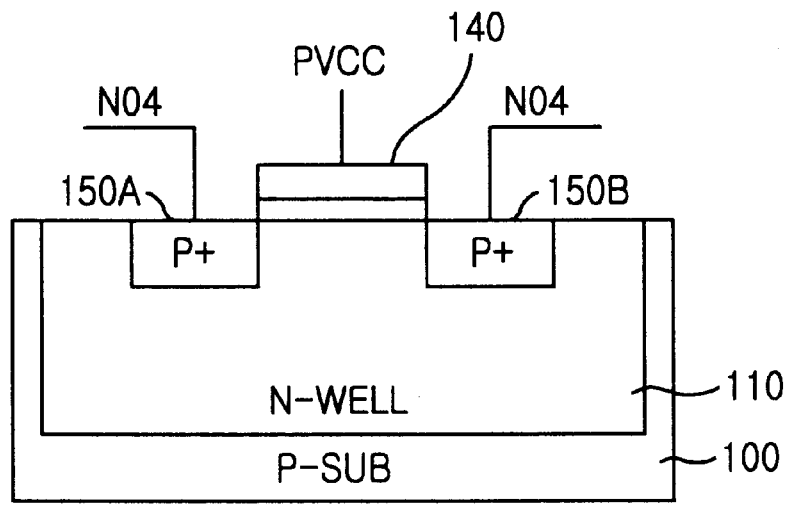

Referring to FIG. 6C, an N well 110 is formed in a P-type substrate 100. A first P+ area 150A and a second P+ area 150B are formed in the N well 110 and an insulation film and a gate electrode 140 are subsequently formed on top of the substrate 100 between the first and the second P+ areas 150A and 150B. A gate electrode 140 is coupled to the positive voltage generating port PVCC of the voltage generator 40 in FIG. 1 and the first and the second P+ areas 150A and 150B are coupled to the fourth node N4 of FIG. 3.

Figure 6D:
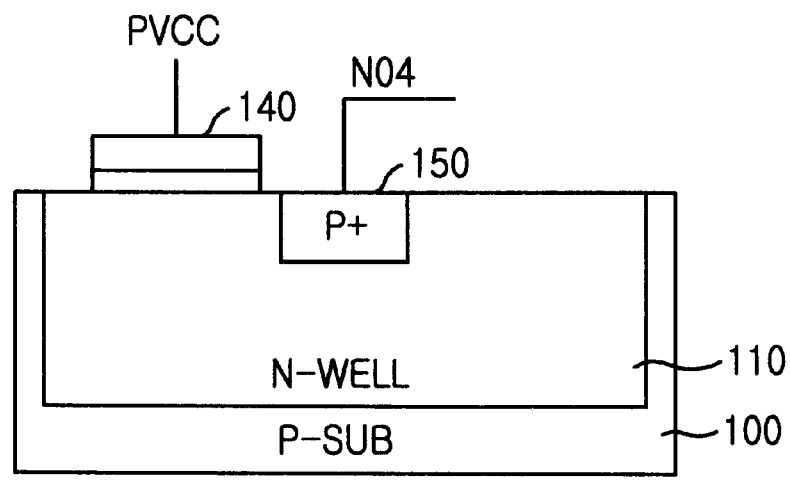

Referring to FIG. 6D, an N well 110 is formed in a P-type substrate 100 and a P+ area 150 is formed in the N well 110. An insulation film and a gate electrode 140 are subsequently formed on top of the substrate 100 aside of the P+ areas 150. A gate electrode 140 is coupled to the positive voltage generating port PVCC of the voltage generator 40 in FIG. 1 and the P+ area 150 is coupled to the fourth node N4 of FIG. 3.

Figure 6E:
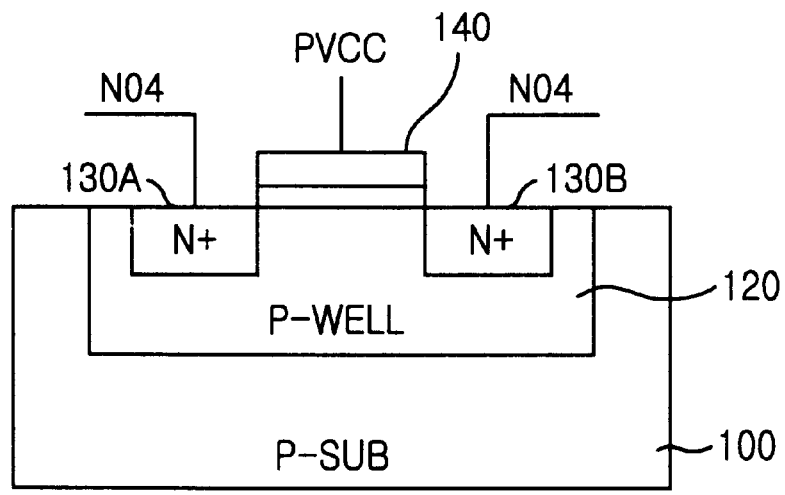

Referring to FIG. 6E, an N well 110 is formed in a P-type substrate 100. A first N+ area 130A and a second N+ area 130B are formed in the N well 110 and an insulation film and a gate electrode 140 are subsequently formed on top of the substrate 100 between the first and the second NP+ areas 130A and 130B. A gate electrode 140 is coupled to the positive voltage generating port PVCC of the voltage generator 40 in FIG. 1 and the first and the second N+ areas 130A and 130B are coupled to the fourth node N4 of FIG. 3.

In FIGS. 6A to 6E, by coupling the PVCC (7 V) to the gate electrode and 0 V to a junction, dielectric breakdown occurs at an edge between the gate electrode and the junction so that it is turned on between the gate electrode and the junction.

Figure 6F:
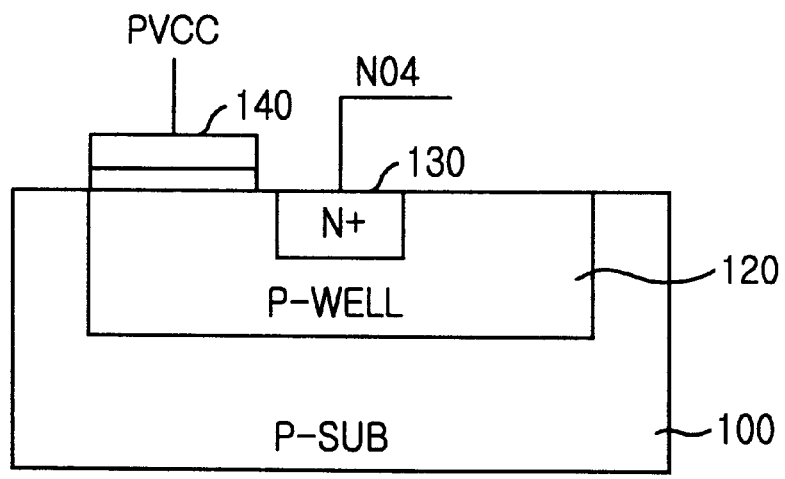

Referring to FIG. 6F, an N well 110 is formed in a P-type substrate 100 and an N+ area 130 is formed in the N well 110. An insulation film and a gate electrode 140 are subsequently formed on top of the substrate 100 aside of the N+ areas 130. A gate electrode 140 is coupled to the positive voltage generating port PVCC of the voltage generator 40 in FIG. 1 and the N+ area 130 is coupled to the fourth node N4 of FIG. 3.

The antifuse device as shown in FIGS. 6A and 6B are constructed by a triple well NMOS transistor and those as shown in FIGS. 6C and 6D are constructed by a triple well PMOS transistor. The antifuse devices as shown in FIGS. 6E and 6F are constructed by a triple well NMOS transistor. The P well as shown in FIGS. 6E and 6F is remained as floating state or coupled to the junction and the N well is coupled to the VCC. The N well as shown in FIGS. 6C and 6D is remained as floating state or coupled to the junction. The P well as shown in FIGS. 6E to 6F is remained as floating state or coupled to the junction.

As described above, the antifuse device of the MOS structure is programmed electrically to replace the defective cell of the memory device with the redundancy cell. Particularly, the present invention can repair the defect generated after burn-in test so that productivity of the memory device improved.

While the present invention has been shown and described with respect to the particular embodiments, it will be apparent to those skilled in the art that many changes and modifications may be made without departing from the spirit and scope of the invention as defined in the appended claims.

What is claimed is:

1. A memory repair circuit comprising:
   a plurality of antifuse devices, each programmed when a power voltage and a negative voltage are supplied to first and second electrodes of the antifuse device, respectively;
   a latching means for detecting and latching a program state of the antifuse device; and
   a redundancy block for replacing a defective cell with a redundant cell based on an output of the latching means.

2. The memory repair circuit as recited in claim 1, further comprising:
   an address multiplexer for selecting one of the antifuse devices; and
   a voltage generator for supplying the negative voltage to the second electrode of a selected antifuse device.

3. The memory repair circuit as recited in claim 1, wherein the antifuse device comprises an NMOS transistor having a source and a drain in a triple P well and a gate coupled to a power voltage, and the source and drain are coupled to one another and to a negative voltage.

4. The memory repair circuit as recited in claim 3, wherein the triple P well remains floating or coupled to the drain or source.

5. The memory repair circuit as recited in claim 1, wherein the antifuse device comprises a NMOS transistor having only one of a source and a drain in a triple P well and a gate coupled to a power voltage, and only one of the source and drain is coupled to a negative voltage.

6. The memory repair circuit as recited in claim 5, wherein the triple P well remains floating or coupled to the drain or source.

7. The memory repair circuit as recited in claim 1, wherein the antifuse device comprises a PMOS transistor having a source and a drain in a N well of a P-type substrate and a gate coupled to a power voltage, and the source and drain are coupled to one another and to a negative voltage.

8. The memory repair circuit as recited in claim 7, wherein the N well of the PMOS transistor remains floating.

9. The memory repair circuit as recited in claim 1, wherein the antifuse device comprises a MOS transistor having only one of a source and a drain in a N well of the P-type substrate and a gate coupled to a power voltage, and the only one of the source and drain is coupled to a negative voltage.

10. A memory repair circuit comprising:
    a power-up reset circuit for outputting a power voltage when power transits from 0 V to a predetermined voltage;
    an address multiplexer for outputting a signal for selecting an antifuse device to program;
    a voltage generator for supplying a program voltage;
    an antifuse circuit for programming the antifuse device based on an output of the power-up reset circuit, the address multiplexer and the voltage generator, and sensing whether the antifuse device is programmed; and
    a redundancy block for replacing a detective cell with a redundancy cell based on an output of the antifuse circuit.

11. The memory repair circuit as recited in claim 10, wherein the antifuse device comprises a NMOS transistor having a source and a drain in a triple P well and a gate coupled to a power voltage, and the source and drain are coupled to one another and to a negative voltage.

12. The memory repair circuit as recited in claim 11, wherein the triple P well remains floating or coupled to the drain or source.

13. The memory repair circuit as recited in claim 10, wherein the antifuse device comprises a NMOS transistor having only one of a source and a drain in a triple P well and a gate coupled to a power voltage, and the only one of the source and drain is coupled to a negative voltage.

14. The memory repair circuit as recited in claim 13, wherein the triple P well remains floating or coupled to the drain or source.

15. The memory repair circuit as recited in claim 10,
    wherein the power-up reset circuit includes circuitry for providing first, second, and third control signals; and
    wherein the antifuse circuit includes:
      a bias controlling means for, when a negative voltage is applied to one electrode of the antifuse device, turning on or off the power voltage applied to the other electrode of the antifuse device, depending on an output signal of the address multiplexer and the first and second control signals of the power-up reset circuit; and
      a latching means for latching a program state of the antifuse device depending on the first and third control signals of the power-up reset circuit.

16. The memory repair circuit as recited in claim 15, wherein the bias controlling means includes:
    a NOR gate for logically combining the output signal of the address multiplexer and the first control signal of the power-up reset circuit;
    a transistor for passing the power voltage transferred through a switching means for switching the power voltage to ground depending on an output of the NOR gate; and
    a transistor coupled to the switching means and a voltage input port of the antifuse device, and having a gate coupled to the ground.

17. The memory repair circuit as recited in claim 15, wherein the latching means includes:
    a switching means for switching the power voltage depending on the third control signal from the power-up reset circuit;
    a first transistor coupled between the switching means and a first node and turned on depending on the first control signal from the power-up reset circuit;
    a second transistor coupled between the first node and the ground and having a gate coupled to a power voltage input port of the antifuse device; and
    a latch circuit for latching an electric potential at a junction of the switching means and the second transistor.

18. The memory repair circuit comprising:
    a plurality of antifuse devices, each antifuse device programmed when a high voltage is supplied to a first electrode of the antifuse device and a voltage lower than a power voltage is supplied to a second electrode of the antifuse device;
    a latching means for detecting and latching a program state of each antifuse device; and
    a redundancy block for replacing a defective cell with a redundancy cell depending on an output of the latching means.

19. The memory repair circuit as recited in claim 18, further comprising:
    an address multiplexer for selecting one of the antifuse devices; and
    a voltage generator for supplying the high voltage to the first electrode of a selected antifuse device.

20. The memory repair circuit as recited in claim 19, wherein the triple P well remains floating or coupled to the drain or source.

21. The memory repair circuit as recited in claim 20, wherein the triple P well remains floating or coupled to the drain or source.

22. The memory repair circuit as recited in claim 21, wherein the PMOS N well remains floating.

23. The memory repair circuit as recited in claim 18, wherein the antifuse device comprises an NMOS transistor having a source and a drain in a triple P well and a gate coupled to the high voltage, and the source and the drain are coupled to one another and to the voltage lower than the power voltage.

24. The memory repair circuit as recited in claim 18, wherein the antifuse device comprises a MOS transistor having only one of a source and a drain in a triple P well and a gate coupled to the high voltage, and one of the source and drain is coupled to the voltage lower than the power voltage.

25. The memory repair circuit as recited in claim 18, wherein the antifuse device comprises a PMOS transistor having a source and a drain in a N well of the P-type substrate and a gate coupled to the high voltage, and the source and drain are coupled to one another and to the voltage lower than the power voltage.

26. The memory repair circuit as recited in claim 18, wherein the antifuse device comprises a MOS transistor having only one of a source and a drain in an N well of the P-type substrate and a gate coupled to a power voltage, and only one of the source and the drain is coupled to a negative voltage.

27. The memory repair circuit as recited in claim 26, wherein the P well remains floating.

28. The memory repair circuit as recited in claim 27, wherein the antifuse device comprises a MOS transistor having only one of a source and a drain in a P well and a gate coupled to the high voltage, and only one of the source and drain is coupled to the voltage lower than the power voltage.

29. The memory repair circuit as recited in claim 18, wherein the antifuse device comprises a NMOS transistor having a source and a drain in a P well and a gate coupled to the power voltage, and the source and drain is coupled to each other and to the voltage lower than the power voltage.

30. The memory repair circuit as recited in claim 18, wherein the antifuse circuit further comprises:

an address multiplexer for selecting one of the antifuse devices;

a power-up reset circuit for providing first, second, third and fourth control signals;

a bias controlling means for, when the high voltage is applied to a gate of the antifuse device, turning on or off the voltage lower than the power voltage applied to a source and drain of the antifuse device, depending on an output of the address multiplexer and the first and fourth control signals of the power-up reset circuit;

a latching means for latching a program state of the antifuse device depending on the third and the fourth control signals of the power-up reset circuit.

31. The memory repair circuit as recited in claim 30, wherein the bias controlling means includes:

a switching means for transferring the power voltage to a first node depending on the fourth control signal;

a first transistor coupled to between a connection node of the source and drain of the antifuse device and the first node, and having a gate coupled to the power voltage;

a second transistor coupled between the first node and the ground, and turned on depending on an output signal of the address multiplexer; and a third transistor coupled parallel with the second transistor and turned on depending on the first control signal of the power-up reset circuit and a high on-resistance of the third transistor.

32. The memory repair circuit as recited in claim 30, wherein the latching means includes:

a switching means for transferring the power voltage to a first node depending on the third control signal;

a first transistor coupled between the first node and a second node and turned on depending on the first control signal;

a second transistor coupled between the second node and the ground and turned on depending on the program state of the antifuse device; and a latch circuit for latching an electric potential at the first node.

* * * * *

UNITED STATES PATENT AND TRADEMARK OFFICE
CERTIFICATE OF CORRECTION

PATENT NO.   : 6,477,094 B2
DATED        : November 5, 2002
INVENTOR(S)  : Phil-Jung Kim et al.

It is certified that error appears in the above-identified patent and that said Letters Patent is hereby corrected as shown below:

Title page,
Item [57], ABSTRACT,
Line 9, "defect" should read -- defective --.

Column 7,
Line 49, "detective" should read -- defective --.

Column 10,
Line 16, after "coupled" delete "to".

Signed and Sealed this

Sixteenth Day of September, 2003

JAMES E. ROGAN
*Director of the United States Patent and Trademark Office*